United States Patent
Drane

(10) Patent No.: US 8,357,852 B2
(45) Date of Patent: Jan. 22, 2013

(54) LATCHING FLOOR BOX COVER

(75) Inventor: Mark R. Drane, Germantown, TN (US)

(73) Assignee: Thomas & Betts International, Inc., Wilmington, DE (US)

( * ) Notice: Subject to any disclaimer, the term of this patent is extended or adjusted under 35 U.S.C. 154(b) by 242 days.

(21) Appl. No.: 12/707,485

(22) Filed: Feb. 17, 2010

(65) Prior Publication Data

US 2010/0206603 A1  Aug. 19, 2010

Related U.S. Application Data

(60) Provisional application No. 61/153,888, filed on Feb. 19, 2009.

(51) Int. Cl.
*H05K 5/03* (2006.01)
(52) U.S. Cl. .............. 174/66; 174/67; 439/142
(58) Field of Classification Search .......... 174/66, 174/67; 439/536, 142, 136; 220/241, 242; 312/328; D8/353; D17/177
See application file for complete search history.

(56) References Cited

U.S. PATENT DOCUMENTS

| | | |
|---|---|---|
| 3,794,956 A | 2/1974 | Dubreuil |
| 4,096,347 A | 6/1978 | Penczak et al. |
| 4,237,666 A | 12/1980 | Kohaut |
| 4,264,779 A | 4/1981 | Rhodes et al. |
| 4,511,198 A | 4/1985 | Mitchell et al. |
| 4,551,577 A | 11/1985 | Byrne |
| 4,721,476 A | 1/1988 | Zeliff et al. |
| 5,023,396 A | 6/1991 | Bartee et al. |
| 5,361,541 A | 11/1994 | Szyjkowski |
| 5,422,434 A | 6/1995 | Wuertz et al. |
| 5,888,078 A | 3/1999 | Lecreux et al. |
| 5,954,525 A | 9/1999 | Siegal et al. |
| 6,179,634 B1 * | 1/2001 | Hull et al. ............... 439/142 |
| 6,265,662 B1 | 7/2001 | Riedy et al. |
| 6,417,446 B1 | 7/2002 | Whitehead |
| 6,527,566 B1 | 3/2003 | Lambiaso |
| 6,618,996 B1 | 9/2003 | Szyjkowski |
| 6,820,364 B1 * | 11/2004 | Tyson .................. 43/17.5 |
| 6,840,785 B2 * | 1/2005 | Drane ................... 439/138 |
| 6,843,669 B2 * | 1/2005 | Drane et al. ............ 439/142 |
| 7,078,616 B2 | 7/2006 | Roesch et al. |
| 7,082,729 B2 | 8/2006 | Cole et al. |
| 7,105,745 B2 | 9/2006 | Drane et al. |
| 7,166,798 B2 | 1/2007 | Cole |
| 7,183,503 B2 | 2/2007 | Bowman et al. |
| 7,243,816 B2 * | 7/2007 | Aochi .................. 220/829 |
| 7,271,351 B2 | 9/2007 | Drane |
| 7,319,193 B2 | 1/2008 | Halterman |
| 7,626,120 B1 | 12/2009 | Golden et al. |
| 8,013,242 B1 | 9/2011 | Thibault et al. |
| 8,119,912 B2 | 2/2012 | Thibault et al. |
| 2010/0206603 A1 | 8/2010 | Drane |

* cited by examiner

*Primary Examiner* — Dhirubhai R Patel
(74) *Attorney, Agent, or Firm* — Hoffmann & Baron, LLP

(57) ABSTRACT

An electrical box cover includes a frame securable to an electrical box. The frame defines an opening to permit access to the electrical box. A lid is pivotally mounted to the frame and movable between an open and closed position. A lid biasing device is disposed between the lid and the frame, the lid biasing device urging the lid away from the closed position. A latch is disposed on the frame and movable between a latched and unlatched position. The latch, when in the latched position, engages the lid and retaining the lid in the closed position. When the latch is in the unlatched position, the lid biasing device lifts at least a portion of the lid at least partially above the frame.

18 Claims, 5 Drawing Sheets

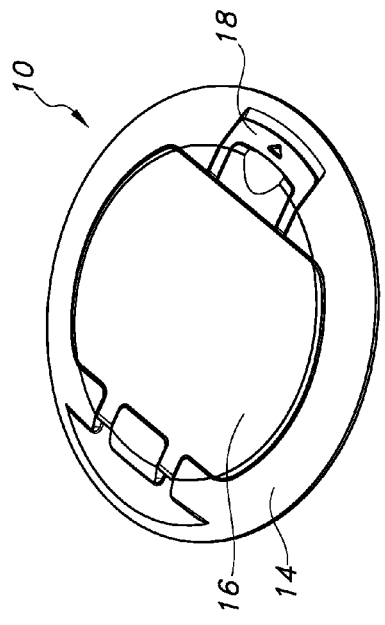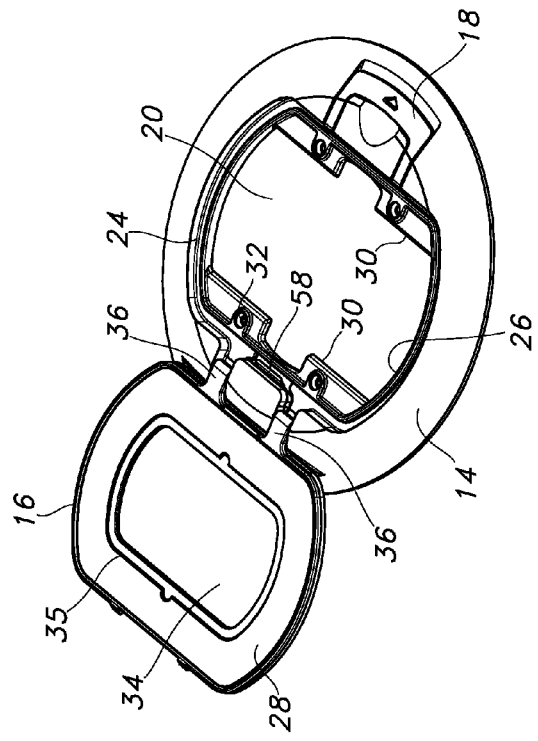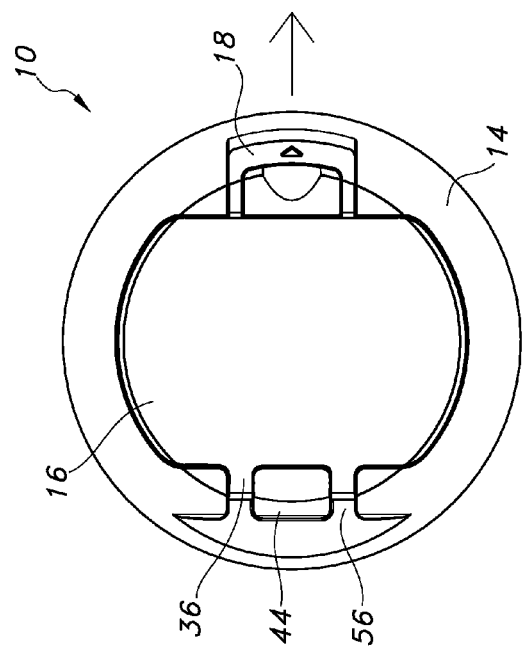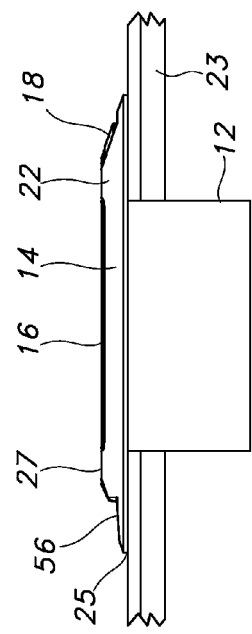

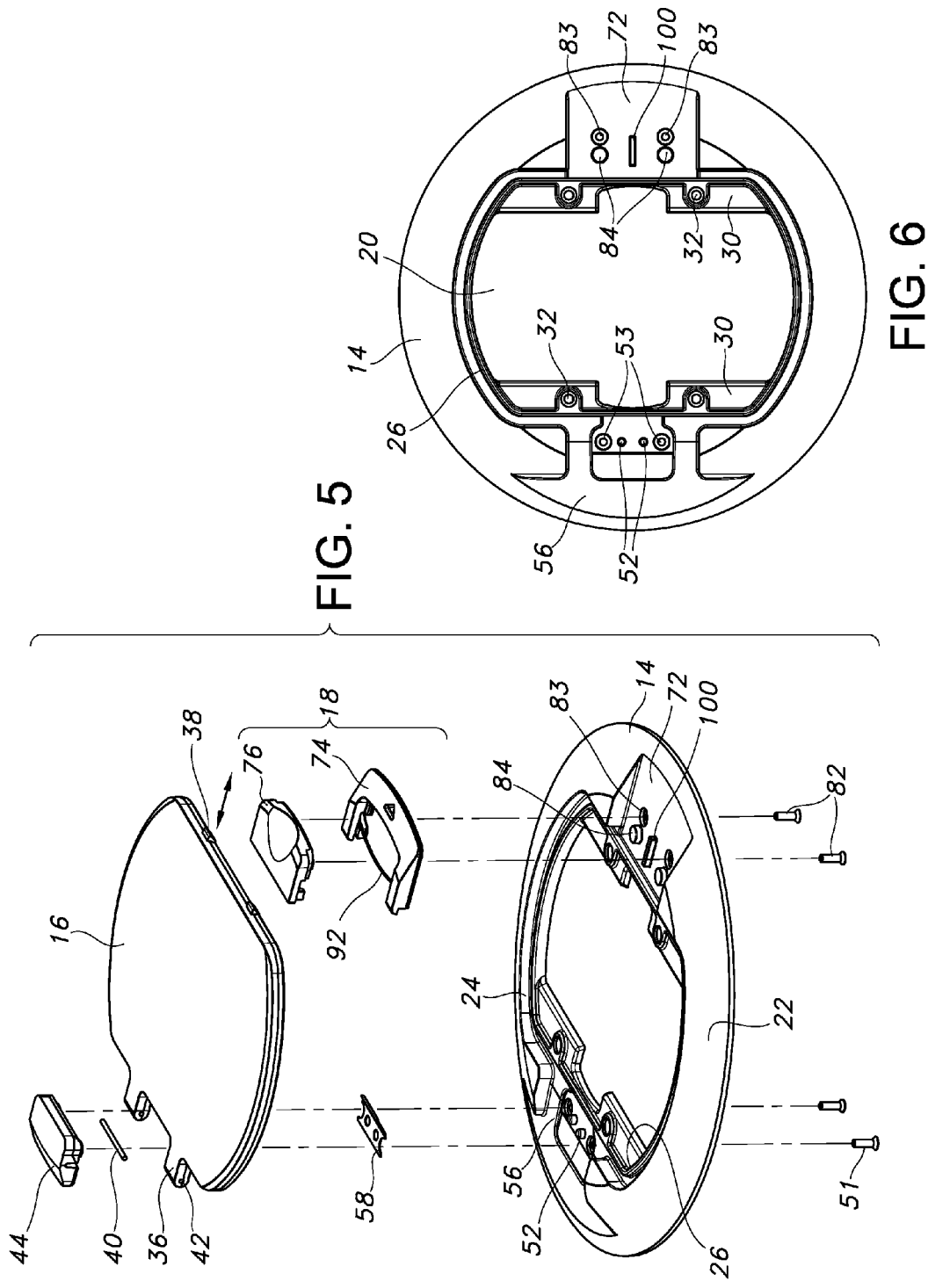

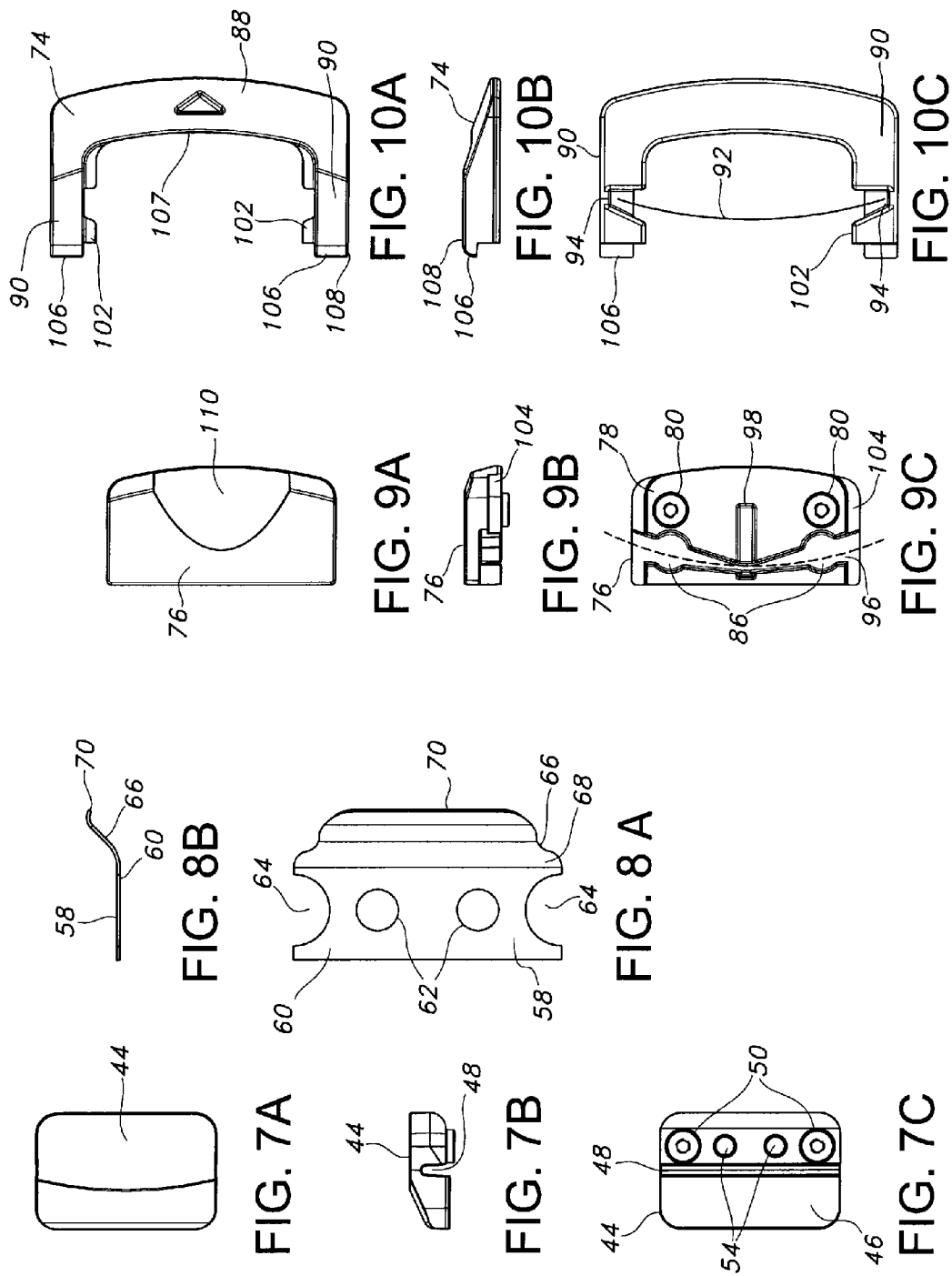

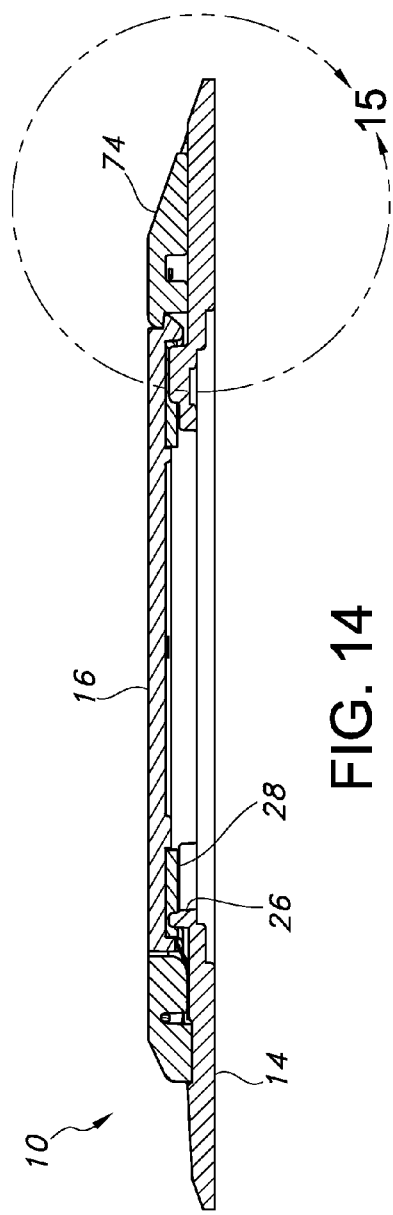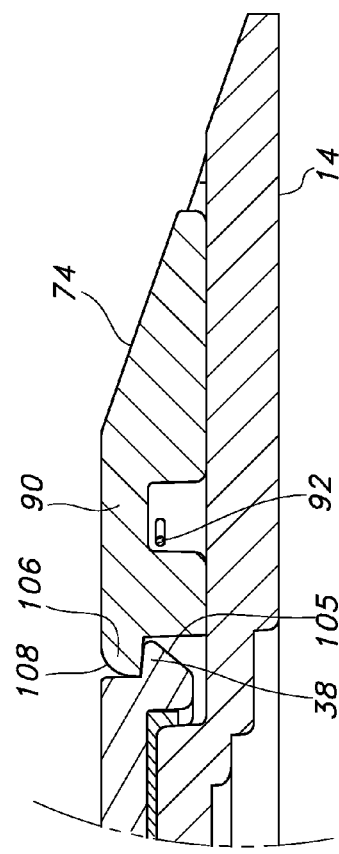

LATCHING FLOOR BOX COVER

This application claims the benefit of priority to U.S. Provisional Patent Application Ser. No. 61/153,888 filed on Feb. 19, 2009, which is incorporated by reference herein in its entirety for all purposes.

FIELD OF THE INVENTION

The present invention relates to a floor box cover, and more particularly, to an electrical floor box cover having a lid which is selectively latchable in a closed position.

BACKGROUND OF THE INVENTION

The use of an electrical junction or outlet box to accommodate electrical cable terminations is well known in the art. These boxes typically house electrical components, such as electrical receptacles, jacks, plugs and other devices. The electrical box permits the electrical cables to connect to the electrical components housed inside the box. In certain applications, these electrical boxes are used in floor installations, and are referred to as floor boxes.

When an electrical box is positioned in the floor, it is typically provided with a cover in order to protect the electrical components disposed within the box. The cover typically includes a lid which may be moved between an open and closed position in order to selectively permit access to the electrical components. The lids may be secured in the closed position in order to prevent them from being inadvertently opened. Typically, the lid is retained in the closed positioned by a latch that is activated through the use of a tool such as a screwdriver. For example, the latching member may include a rotating latch which rotates between an open and closed position, thereby selectively securing and releasing the lid. Once the lid is unlatched, the tool is also typically needed to pry the lid to the open position.

Since a tool is needed to open the lid, this creates an inconvenience and requires a user to go through additional steps and secure additional equipment in order to simply open the lid and, for example, insert a plug in the receptacle. The tool must also be available at the time the lid is to be secured in the closed position.

In addition, electrical floor box covers are typically designed to have a relatively low profile in order to avoid tripping hazards. This is especially problematic when the lid is in the open position to permit a plug to extend from an electrical component and out of the cover. Lids in the open position typically extend upwardly from the base of the cover. This creates an increased tripping hazard while the electrical box is in use.

Accordingly, it would be desirable to provide an electrical box cover which may be opened and closed without the need for tools and an electrical floor box cover which maintains a low profile even in the open position.

SUMMARY OF THE INVENTION

The present invention provides an electrical box cover with a latchable lid.

The present invention further provides an electrical box cover having a lid biased away from a fully closed position.

The present invention further provides an electrical floor box cover which can be opened and closed without the need for tools.

The present invention still further provides an electrical box cover including a frame securable to an electrical box, the frame defining an opening to permit access to the electrical box. A lid is pivotally mounted to the frame and movable between an open and closed position. A lid biasing device is disposed between the lid and the frame, the lid biasing device urging the lid away from the closed position. A latch is disposed on the frame and movable between a latched and unlatched position. The latch, when in the latched position, engages the lid and retains the lid in the closed position. When the latch is in the unlatched position, the lid biasing device lifts at least a portion of the lid at least partially above the frame.

The present invention still further provides an electrical floor box cover including a frame having a lower surface disposable on a flooring surface and a beveled upper surface. The frame defines an opening to permit access to an electrical box. A lid is pivotally mounted to the frame and movable between an open and closed position. A lid biasing device is disposed between the lid and the frame, the lid biasing device urging the lid away from the closed position. A latch is disposed on the frame and including an actuating member movable between a latched and unlatched position without the use of a tool.

BRIEF DESCRIPTION OF THE DRAWINGS

FIG. 1 is a top perspective view of the floor box cover of the present invention showing a lid in the closed position.

FIG. 2 is a top perspective view of the floor box cover of FIG. 1 showing the lid in the fully open position.

FIG. 3 is a top plan view of the outlet box cover of FIG. 1.

FIG. 4 is a side elevational view of the floor box cover of FIG. 1 shown installed on an electrical box.

FIG. 5 is an exploded perspective view of the cover of FIG. 1.

FIG. 6 is a top plan view of a frame of the cover.

FIG. 7A is a top plan view of a retainer of the present invention.

FIG. 7B is a side view of the retainer of FIG. 7A.

FIG. 7C is a bottom plan view of the retainer of FIG. 7A.

FIG. 8A is a top plan view of a lid biasing device.

FIG. 8B is a side elevational view of the lid biasing device.

FIG. 9A is a top plan view of a latch retainer

FIG. 9B is a side elevational view of the latch retainer.

FIG. 9C is a bottom plan view of the latch retainer.

FIG. 10A is a top plan view of a latch actuating member.

FIG. 10B is a side elevational view of the latch actuating member.

FIG. 10C is a bottom plan view of the latch actuating member.

FIG. 14 is a cross-sectional view of the cover showing the lid in the closed and latched position.

FIG. 15 is a detail view of the latch of FIG. 14

DETAILED DESCRIPTION OF THE PREFERRED EMBODIMENTS

Figure 12:
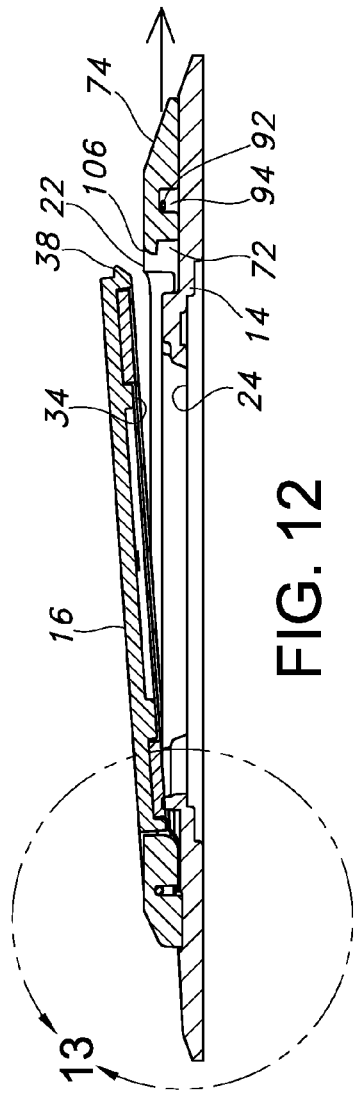
FIG. 12 is a side cross-sectional view taken along line 12-12 of FIG. 11 showing the cover in an initial partially open position.

With reference to FIGS. 1-4, the present invention includes a cover 10 for an electrical box 12. The cover 10 includes a frame 14 securable to the electrical box 12. A lid 16 is pivotally secured to the frame 14 and movable between an open and closed position. A latch 18 is disposed on the frame 14 in order to maintain the lid 16 in the closed position. In the closed position, an access opening 20 formed by frame 14 is covered Access opening 20 permits entry to the electrical box and the outlet box 12 and the electrical component housed therein. The electrical box cover 10 may be in a preferred embodiment in the form of a floor box cover. However, it is within the contemplation of the present invention that the cover 10 may be used in other applications.

Frame 14 may be in the form of a generally annular member; however, it is within the contemplation of the present invention that the frame could be formed of various configurations. Frame 14 may include a beveled upper surface 22 having a top 27. The upper surface 22 tapers as the frame extends toward its outer periphery as shown in FIG. 4. Beveled upper surface 22 provides a smooth transition between a flooring surface 23 and the outlet box cover 10. Frame 14 may have a bottom surface 25 which sits upon a flooring surface 23.

Figure 13:
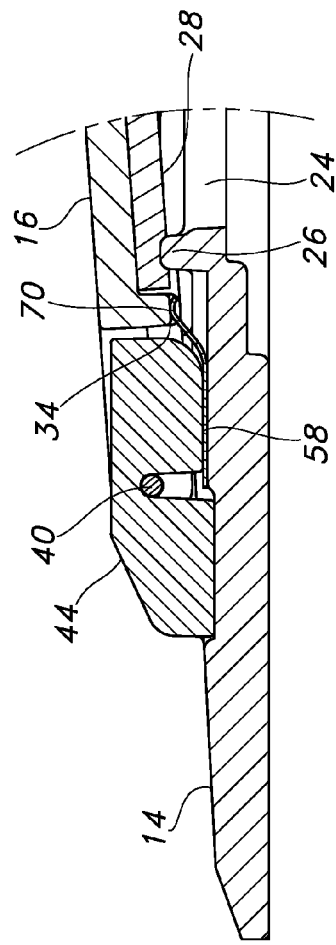
FIG. 13 is a detailed view of the hinge section of FIG. 12.

With additional reference to FIGS. 5 and 6, the frame 14 may include a lid recess 24 surrounding the access opening 20. The recess 24 may be dimensioned to receive lid 16 when in a closed position as shown in FIGS. 3 and 4. When the lid 16 is in the closed position, it preferably does not extend above the frame 14. The recess 24 may include an upstanding wall-like rib 26 which at least partially bounds the access opening 20. In a preferred embodiment, the rib 26 may completely surround the access opening 20. The rib 26 may interact and engage a gasket 28 disposed on the undersurface of lid 16 as shown in FIG. 13. Engagement between the gasket 28 and the rib 26 helps provide a water-resistant feature to the cover 10. A plurality of tabs 30 may extend inwardly from the rib 26 toward the opening 20. Tabs 30 may include apertures 32 that permit fasteners (not shown) to secure the electrical box 12 to the cover frame 14.

Lid 16 may include a general planar member having an undersurface 34 including a channel 35 for receiving gasket 28. The lid 16 may include a pair of spaced protruding hinge members 36 extending from one edge thereof. Hinge members 36 permit pivotal mounting between the lid 16 and the frame 14. With specific reference to FIG. 5, the lid 16 may further include a pair of spaced lugs 38 extending from a side opposite to the side from which the hinge members 36 extend. The lugs 38 may engage latch 18 in order to maintain the lid 16 in the closed position.

Lid 16 may be pivotally secured to the frame 14 by a hinge pin 40 which extends into and between the hinge members 36. Hinge members 36 may include openings 42 in order to allow the pin 40 to be slid therein. The pin 40 is held on the frame 14 by a lid retainer 44. With reference to FIGS. 5 and 7A-C, lid retainer 44 extends over the hinge pin 40 and is secured to the frame 14. The lid retainer 44 may include an undersurface 46 having a longitudinally extending slot 48 for receiving the hinge pin 40. A pair of threaded openings 50 may also be formed on the undersurface of the lid retainer in order to permit threaded fasteners 51 (FIG. 5) to extend through openings 53 in the frame and into the retainer 44 thereby securing the retainer to the frame 14. The frame 14 may include a pair of alignment pins 52 which mate with a pair of blind holes 54 formed in the lid retainer undersurface 46 in order to properly align the lid retainer 44 with respect to the frame. Frame 14 may include a hinge relief 56 for receiving the hinge pin 40, the lid retainer 44, and the lid hinge members 36. Hinge relief 56 extends outwardly beyond the lid retainer 44 toward the perimeter of the frame 14. The hinge relief 56 permits the lid retainer 44 to be flush with the top 27 of the upper surface.

As shown in FIG. 2, the hinge relief 56 further permits the lid 16 to be rotated approximately 180 degrees from the closed position to the fully open position so that it essentially lies flat when in the fully open position, thereby reducing the risk of tripping over an open lid. The relief 56 is configured to receive the hinge members 36 as well as a portion of the lid adjacent the hinge members 36.

With reference to FIGS. 5, 8A-8B and 12-13, cover 10 may also include a biasing device 58 which tends to urge the lid 16 upwardly from the fully closed position. The biasing device 58 may include a spring member formed of a flat sheet of spring steel which is disposed between the lid retainer 44 and the frame 14. The biasing device 58 may include a base 60 including a pair of holes 62 extending there-through which is sized to receive the alignment pins 52 extending from the frame 14 (FIGS. 5 and 6). The ends of the base may include semicircular cutouts 64 in order to permit the fastening members 51 securing the lid retainer 44 to the frame 14 to pass there-through. Accordingly, when the lid retainer 44 is secured to the frame 14, the biasing device 58 is also secured. The biasing device 58 includes a member 66 extending generally upwardly on an incline from a base side edge 68. This upward extending member terminates in a generally rounded lip 70. The member 66 and lip 70 extend from under the lid retainer 44 toward the lid 16 as shown in FIG. 13. The lip 70 is positioned such that it engages the lid undersurface 34 when the lid 16 approaches the closed position. The biasing device 58 acts on a portion of said lid adjacent to a pivotal connection between the lid 16 and the frame 14.

In order to move the lid 16 to the fully closed position wherein the lid fully sits within recess 24, the lid 16 must be urged against the force of the biasing device 58. If the lid 16 is released, the biasing device 58 pivots the lid to an initial opened positioned as shown in FIG. 12. In the initial partially opened position, the lid 16 rests on the biasing device lip 70 and the lid substantially overlies the access opening 20. The lid 16 will remain in that position until a user either further rotates the lid 16 to the fully open position, as shown in FIG. 2, thereby uncovering the access opening 20, or pushes the lid to the fully closed position where it engages the latch 18 and is retained thereby as shown in FIG. 1.

The thin configuration of biasing device 58 allows it to be easily installed between the frame and the lid without requiring excessive space for installation or adding unnecessary thickness to the cover. This is especially important to floor box covers wherein a minimal amount of protrusion above the floor surface is desired.

With reference to FIGS. 5, 6, and 9A through 10C, the lid 16 is retained in the fully closed position against the bias of the biasing device 58 by latch 18. The latch 18 may be disposed on the frame 14 within a latch recess 72 and be flush with the top of the frame 27 (FIG. 4). Latch 18 may include an actuating member 74, shown in FIGS. 10A-C, which is moveable by a user between a latched and unlatched position. Latch 18 may further include a latch holder 76, shown in FIGS. 9A-C, which secures the actuating member to the frame 14. Holder 76 includes a bottom surface 78 having a pair of threaded openings 80 configured to receive fastening hardware 82 (FIG. 5) which secures the holder 76 to the frame 14. Clearance apertures 83 extend through the frame 14 to permit the fastening hardware 82 to extend there-through and engage the threaded openings 80. A pair of bosses 84 extends upwardly from the base of the latch recess 72 and may be inserted in relief holes 86 formed in the latch holder bottom surface 78.

The actuating member 74 is a generally C-shaped device having a central portion 88 with two legs 90 extending from ends of the central portion 88. A biasing member in the form of a spring wire 92 is secured at its ends to the legs 90. The legs 90 may include in their bottom surfaces notches 94 for receiving the ends of the spring wire 92. The spring wire 92 may be bowed in the middle when positioned within the actuating member 74.

Latch holder 76 covers the spring wire 92 and retains the actuating member on the frame 14. The latch holder bottom surface 78 includes a curved groove 96 in which a portion of the spring wire 92 sits. The groove 96 has a width that widens as the groove extends away from the middle of the latch retainer. The bottom surface 78 further includes a medially disposed elongate slot 98. Slot 98 extends into and across groove 96. Slot 98 is configured to receive a protrusion 100 (FIG. 5) extending upwardly from the base of the latch recess between the two bosses 84. When the latch holder 76 is secured to the frame, the protrusion extends into the slot 98 and supports the portion of the spring wire 92 within the groove 96. Bosses 84 extend into recesses 101 and also support the spring wire 92 within the groove 96. With the spring wire 92 retained within the groove 96, the actuating member 74 may be urged in a sliding manner outwardly to an unlatched position away from the access opening 20, thereby flexing the spring wire 92. When the actuating member 74 is released, the wire 92 returns to an initial pre-flexed state and actuating member 74 is moved back toward the access opening 20 and a latched position.

The actuating member 74 may be guided in its movement between the latched and unlatched position. Guidance is provided by the cooperation of tabs 102 projecting from the actuating member legs 90 toward each other and undercuts 104 formed on the side edges of the latch retainer 76. Tabs 102 slide in a guided manner within the space provided by the undercuts 104.

With reference to FIGS. 14 and 15, when the lid 16 is moved to the fully closed position, the actuating member 74 engages the lid 16 and retains it in that position. This is achieved through an engagement between catches 106, disposed on the ends of the legs 90, and the lugs 38 extending from the side of the lid. The catches 106 may have a rounded upper surface 108 and the lugs 38 may have a tapered surface 105. Accordingly, when the lugs 38 engage the catches from the top, as when closing the lid, the actuation member 74 is moved toward the unlatched position such that the lugs 38 can slip beneath the catches 106. Once in that fully closed position, the actuating member catches 106 will move back into position above the lid lugs 38 thereby retaining the lid 16 in the fully closed position shown in FIGS. 1 and 4. Accordingly, the lid 16 can be locked in the fully closed position without the use of any tools.

Figure 11:
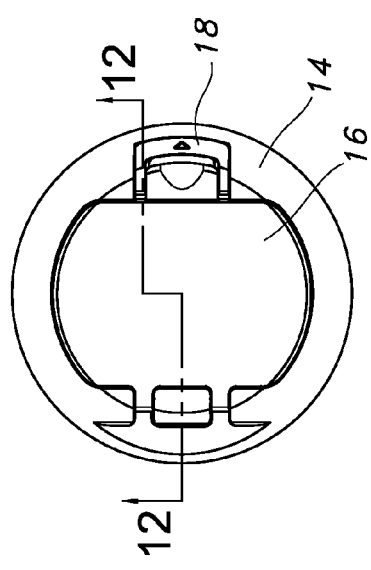
FIG. 11 is a top plan view of a cover showing the latch actuating member in the open position.

The top surface of the latch holder 76 may include a concave portion 110 (FIG. 9A) to allow a user to engage a generally vertically oriented surface 107 (FIG. 10A) of the actuating member 74 with their finger. Upon such engagement, the actuating member 74 may be pulled away from the lid 16 to the unlatched position. In this unlatched position, the catches 106 are moved clear of the lid lugs 38 and the lid 16, under the force of the biasing device 58, partially pops open. (FIGS. 11 and 12). At least a portion of the lid undersurface 34 is raised above the frame upper surface 22, and therefore, a user may easily grab the partially open lid 16 and rotate it to the fully open position shown in FIG. 2. Accordingly, a user can unlatch and open the lid 16 without the need for tools. In this way, a user can easily access the outlet box and any receptacle secured therein.

The latch 18, with its related components, is mounted entirely on the upper surface of the frame within the latch relief 72. In addition, the only openings in the frame used to accommodate the latch are the clearance apertures 83. However, they are filled with fastening hardware 82, thereby, resisting water intrusion through the latch.

In operation, when a user desires to open the cover, the actuating member 74 is pulled back to the unlatched position. The biasing device 58 rotates the lid 16 such that at least a portion of the lid is raised above the frame top 27. The lid 17 then assumes the initial open position where it is unlatched, but still covers the access opening 20. The biasing device 58 only acts over a relatively small amount of the lid's rotation; therefore, unlatching the lid causes the lid to raise a relatively small degree. To fully open the cover, a user may engage a portion of the lid 16 protruding above the frame and rotate the lid 16 to the fully open position.

Although preferred embodiments of the present invention have been described herein with reference to the accompanying drawings, it is to be understood that the invention is not limited to those precise embodiments and that various other changes and modifications may be affected herein by one skilled in the art without departing from the scope or spirit of the invention, and that it is intended to claim all such changes and modifications that fall within the scope of the invention.

What is claimed is:

1. An electrical box cover comprising:
a frame securable to an electrical box, said frame defining an opening to permit access to the electrical box;
a lid pivotally mounted to said frame by a hinge and the lid having an extent of rotation between a fully open and closed position;
a lid biasing device disposed adjacent the hinge and between said lid and said frame, the biasing device being in engagement with said frame, said lid biasing device urging said lid away from said closed position; and
a latch disposed on said frame and movable between a latched and unlatched position, said latch, when in said latched position, engaging said lid and retaining said lid in said closed position, and when in said unlatched position, said lid biasing device lifting at least a portion of said lid at least partially above said frame, said biased device acting on said lid only over a portion of the extent of rotation of said lid.

2. The electrical box cover as defined in claim 1, wherein said biasing device includes a base secured with respect to said frame and a member extending from said base and engaging said lid when said lid is in said closed position, said member being deflectable with respect to said base.

3. The electrical box cover as defined in claim 2, wherein said biasing device member acts on a portion of said lid adjacent to a pivotal connection between said lid and said frame.

4. The electrical box cover as defined in claim 2, wherein said lid biasing device is formed of a piece of spring steel.

5. The electrical box cover as defined in claim 1, wherein said lid is pivotally secured to said frame by a lid retainer, and said biasing device is at least partially disposed between said frame and said lid retainer.

6. The electrical box cover as defined in claim 1, wherein said frame has an upper surface and said lid is substantially flush with said upper surface when in said closed position.

7. The electrical box cover as defined in claim 1, wherein said latch includes an actuating member, a retainer for securing said actuating member to said frame and a latch spring, said latch spring urging said actuating member toward said latched position.

8. The electrical box cover as defined in claim 7, wherein said actuating member is movable to said unlatched position without the need for a tool.

9. The electrical floor box cover as defined in claim 1, wherein said biasing device supports said lid in an initial open position wherein at least a portion of said lid is urged above a top of the frame by the biasing device and said lid covers said access opening.

10. The electrical box cover as defined in claim 1, wherein said lid lies essentially flat adjacent said frame when said lid is in said fully open position.

11. The electrical box cover as defined in claim 10, wherein said lid does not extend above a top of said frame when in the fully open position.

12. The electrical box cover as defined in claim 10, wherein said frame includes a relief formed therein for receiving a portion of said lid when in said fully open position.

13. An electrical floor box cover comprising:
   a frame having a lower surface disposable on a flooring surface and a beveled upper surface, said frame defining an access opening to permit access to an electrical box;
   a lid pivotally mounted to said frame by a hinge and movable between a fully open position in which the access opening is substantially uncovered and a closed position;
   a lid biasing device disposed adjacent the hinge and between said lid hinge and said frame and in engagement with said frame, said lid biasing device urging said lid away from said closed position; and
   a latch disposed on said frame and including an actuating member movable by a user between a latched and unlatched position without the use of a tool, wherein when said actuating member is moved to said unlatched position, the lid biasing device lifts at least a portion of said lid above said frame to an initial open position wherein said lid substantially covers said access opening, and wherein movement of said lid by the user from said initial open position to said fully open position is unassisted by said lid biasing device.

14. The electrical floor box cover as defined in claim 13, wherein said lid biasing device is disposed adjacent a pivotal connection between said lid and said frame.

15. The electrical floor box cover as defined in claim 13, further including a latch spring having a retained portion and movable portion, said movable portion being connected to said actuating member.

16. The electrical floor box cover as defined in claim 15, wherein said actuating member includes a central portion having two spaced legs extending outwardly from said central portion and said latch spring extends between said legs.

17. The electrical floor box cover as defined in claim 16, wherein said latch further includes a retainer securable to said frame and over said spring, said retainer securing said retained portion of said spring.

18. The electrical floor box cover as defined in claim 13, wherein said actuating member includes a surface engagable by a user's finger to permit movement of said actuating member toward said unlatched position.

\* \* \* \* \*